United States Patent
Honke et al.

(10) Patent No.: US 12,104,278 B2
(45) Date of Patent: Oct. 1, 2024

(54) SILICON CARBIDE SUBSTRATE

(71) Applicant: SUMITOMO ELECTRIC INDUSTRIES, LTD., Osaka (JP)

(72) Inventors: Tsubasa Honke, Osaka (JP); Kyoko Okita, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 286 days.

(21) Appl. No.: 17/611,138

(22) PCT Filed: Mar. 19, 2020

(86) PCT No.: PCT/JP2020/012435
§ 371 (c)(1),
(2) Date: Nov. 13, 2021

(87) PCT Pub. No.: WO2020/235205
PCT Pub. Date: Nov. 26, 2020

(65) Prior Publication Data
US 2022/0220637 A1 Jul. 14, 2022

(30) Foreign Application Priority Data
May 17, 2019 (JP) ................................ 2019-093883

(51) Int. Cl.
C30B 29/06 (2006.01)
C30B 29/36 (2006.01)
(Continued)

(52) U.S. Cl.
CPC .............. *C30B 29/36* (2013.01); *C30B 29/06* (2013.01); *C30B 33/00* (2013.01); *H01L 21/02021* (2013.01); *H01L 21/02024* (2013.01); *H01L 21/02052* (2013.01); *H01L 29/1608* (2013.01); *H01L 29/36* (2013.01); *C09G 1/02* (2013.01); *C09G 1/04* (2013.01); *C30B 23/00* (2013.01); *C30B 23/02* (2013.01); *C30B 23/025* (2013.01);
(Continued)

(58) Field of Classification Search
None
See application file for complete search history.

(56) References Cited

U.S. PATENT DOCUMENTS

2004/0106363 A1\* 6/2004 Ishii ........................ B24B 9/065
451/65
2006/0234058 A1 10/2006 Ohmi
(Continued)

FOREIGN PATENT DOCUMENTS

| CN | 101226904 A | * | 7/2008 |
| CN | 104979185 A | * | 10/2015 |

(Continued)

*Primary Examiner* — Jeffrey A Vonch
(74) *Attorney, Agent, or Firm* — Renner, Otto, Boisselle & Sklar, LLP

(57) ABSTRACT

A silicon carbide substrate has a first main surface, a second main surface, and a chamfered portion. The second main surface is opposite to the first main surface. The chamfered portion is contiguous to each of the first main surface and the second main surface. The silicon carbide substrate has a maximum diameter of 150 mm or more. A surface manganese concentration in the chamfered portion is $1 \times 10^{11}$ atoms/cm$^2$ or less.

6 Claims, 5 Drawing Sheets

(51) Int. Cl.
  *C30B 29/64* (2006.01)
  *C30B 33/00* (2006.01)
  *H01L 21/02* (2006.01)
  *H01L 29/16* (2006.01)
  *H01L 29/36* (2006.01)
  *C09G 1/02* (2006.01)
  *C09G 1/04* (2006.01)
  *C30B 23/00* (2006.01)
  *C30B 23/02* (2006.01)

(52) U.S. Cl.
  CPC ........ *C30B 29/64* (2013.01); *H01L 21/02019* (2013.01); *H01L 21/02378* (2013.01); *H01L 21/02529* (2013.01); *Y10T 428/219* (2015.01); *Y10T 428/24355* (2015.01); *Y10T 428/24777* (2015.01); *Y10T 428/24942* (2015.01); *Y10T 428/31* (2015.01)

(56) References Cited

U.S. PATENT DOCUMENTS

| | | | |
|---|---|---|---|
| 2008/0200100 A1* | 8/2008 | Takahashi | H01L 21/67219 438/692 |
| 2008/0303118 A1* | 12/2008 | Arena | H01L 21/02002 117/200 |
| 2009/0262353 A1* | 10/2009 | Benvegnu | B24B 37/013 156/345.25 |
| 2009/0263306 A1* | 10/2009 | Ohmi | C23C 16/01 427/255.28 |
| 2013/0256700 A1* | 10/2013 | Ishibashi | H01L 29/045 257/77 |
| 2013/0264584 A1 | 10/2013 | Okita | |
| 2014/0117380 A1* | 5/2014 | Loboda | B24B 7/228 438/692 |
| 2014/0220299 A1* | 8/2014 | Yoshida | C30B 29/36 428/141 |
| 2016/0032486 A1* | 2/2016 | Hansen | C30B 33/10 117/109 |
| 2016/0045881 A1* | 2/2016 | Spangler | B01J 8/1836 118/716 |
| 2016/0086798 A1 | 3/2016 | Tanaka | |
| 2016/0133465 A1* | 5/2016 | Sasaki | B24B 37/08 438/693 |
| 2016/0189956 A1* | 6/2016 | Hansen | C30B 23/025 117/88 |
| 2016/0208412 A1* | 7/2016 | Sandgren | C30B 29/06 |
| 2016/0233080 A1 | 8/2016 | Tanaka | |
| 2017/0221697 A1 | 8/2017 | Sasaki | |
| 2017/0236905 A1* | 8/2017 | Torimi | H01L 21/304 257/77 |
| 2017/0256391 A1* | 9/2017 | Okita | H01L 21/02013 |
| 2017/0306526 A1 | 10/2017 | Okita | |
| 2019/0345635 A1* | 11/2019 | Vogel | H01L 21/02021 |
| 2019/0348272 A1* | 11/2019 | Ecker | H01L 21/02027 |
| 2019/0367776 A1* | 12/2019 | Matsuo | C08L 1/10 |
| 2021/0301421 A1* | 9/2021 | Nagaya | C30B 33/10 |
| 2022/0220638 A1* | 7/2022 | Okita | H01L 21/02052 |

FOREIGN PATENT DOCUMENTS

| | | | | |
|---|---|---|---|---|
| CN | 108262684 A | * | 7/2018 | ............ B24B 1/00 |
| EP | 3382068 A1 | * | 10/2018 | ............ C30B 23/00 |
| JP | 10116757 A | * | 5/1998 | |
| JP | 2000288887 A | * | 10/2000 | |
| JP | 2004284860 A | * | 10/2004 | |
| JP | 2005-047753 A | | 2/2005 | |
| JP | 2006095637 A | * | 4/2006 | |
| JP | 2008-280207 A | | 11/2008 | |
| JP | 2009043969 A | * | 2/2009 | |
| JP | 2009238891 A | * | 10/2009 | |
| JP | 2011219297 A | * | 11/2011 | |
| JP | 2013-219206 A | | 10/2013 | |
| JP | 2014-231457 A | | 12/2014 | |
| JP | 2014229843 A | * | 12/2014 | |
| JP | 2015-086128 A | | 5/2015 | |
| JP | 2016127051 A | * | 7/2016 | |
| JP | 2016183087 A | * | 10/2016 | |
| JP | 2017069334 A | * | 4/2017 | |
| JP | 2017-523950 A | | 8/2017 | |
| KR | 2009072342 A | * | 7/2009 | ............ C30B 15/10 |
| WO | WO-2004044275 A2 | * | 5/2004 | ............ C30B 15/206 |
| WO | WO-2006041067 A1 | * | 4/2006 | ............ C30B 23/00 |
| WO | WO-2009107567 A1 | * | 9/2009 | ........... C30B 29/403 |
| WO | WO-2011155234 A1 | * | 12/2011 | ........ H01L 21/02378 |
| WO | 2016/017319 A1 | | 2/2016 | |
| WO | 2016/018983 A1 | | 2/2016 | |
| WO | 2016/063632 A1 | | 4/2016 | |

* cited by examiner

SILICON CARBIDE SUBSTRATE

TECHNICAL FIELD

The present disclosure relates to a silicon carbide substrate. The present application claims priority to Japanese Patent Application No. 2019-093883 filed on May 17, 2019, the entire contents of which are incorporated herein by reference.

BACKGROUND ART

WO 2016/063632 (PTL 1) describes a method for cleaning a silicon carbide substrate.

CITATION LIST

Patent Literature

PTL 1: WO 2016/063632

SUMMARY OF INVENTION

A silicon carbide substrate in accordance with the present disclosure includes a first main surface, a second main surface, and a chamfered portion. The second main surface is opposite to the first main surface. The chamfered portion is contiguous to each of the first main surface and the second main surface. The silicon carbide substrate has a maximum diameter of 150 mm or more. A surface manganese concentration in the chamfered portion is $1\times10^{11}$ atoms/cm$^2$ or less.

DETAILED DESCRIPTION

Figure 1:
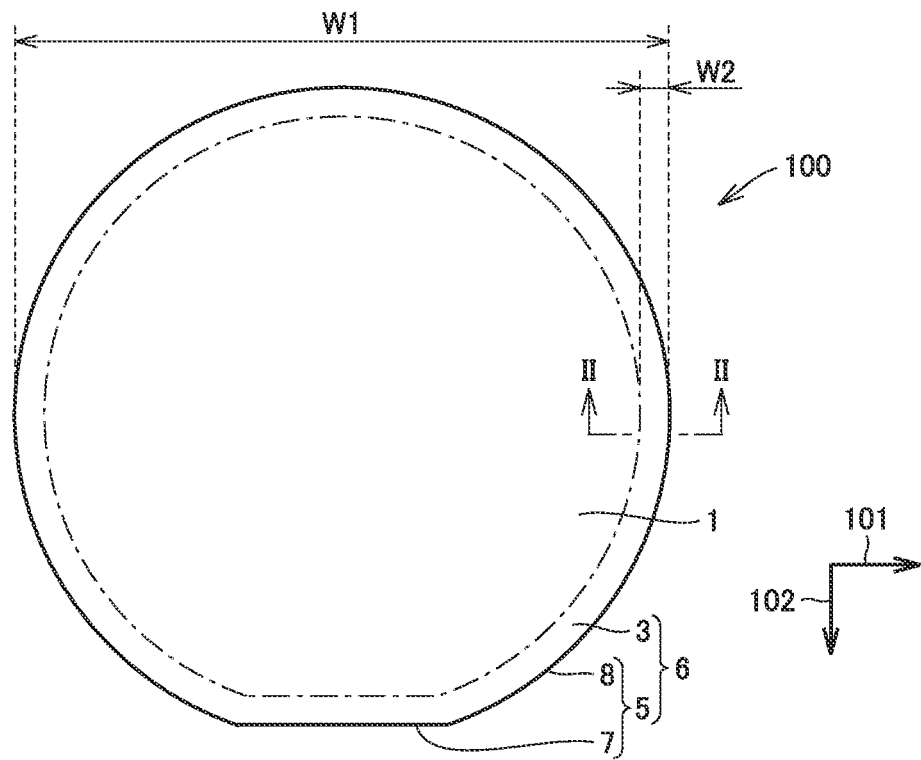
FIG. 1 is a schematic plan view showing a configuration of a silicon carbide substrate in accordance with the present embodiment.

Problem to be Solved by the Present Disclosure

An object of the present disclosure is to provide a silicon carbide substrate with a high cleanliness.

Advantageous Effect of the Present Disclosure

According to the present disclosure, a silicon carbide substrate with a high cleanliness can be provided.

Description of the Embodiment of the Present Disclosure

First, an embodiment of the present disclosure will be described in list form.

(1) A silicon carbide substrate 100 in accordance with the present disclosure includes a first main surface 1, a second main surface 2, and a chamfered portion 6. Second main surface 2 is opposite to first main surface 1. Chamfered portion 6 is contiguous to each of first main surface 1 and second main surface 2. Silicon carbide substrate 100 has a maximum diameter of 150 mm or more. A surface manganese concentration in chamfered portion 6 is $1\times10^{11}$ atoms/cm$^2$ or less.

(2) In silicon carbide substrate 100 in accordance with (1) described above, an arithmetic mean roughness in chamfered portion 6 may be greater than an arithmetic mean roughness in each of first main surface 1 and second main surface 2.

(3) In silicon carbide substrate 100 in accordance with (1) or (2) described above, a surface sodium concentration in chamfered portion 6 may be $1\times10^{8}$ atoms/cm$^2$ or more.

(4) In silicon carbide substrate 100 in accordance with any of (1) to (3) described above, a surface sodium concentration in chamfered portion 6 may be $3\times10^{11}$ atoms/cm$^2$ or less.

(5) In silicon carbide substrate 100 in accordance with any of (1) to (4) described above, a surface potassium concentration in chamfered portion 6 may be $1\times10^{11}$ atoms/cm$^2$ or less.

(6) In silicon carbide substrate 100 in accordance with any of (1) to (5) described above, a surface iron concentration in chamfered portion 6 may be $1\times10^{11}$ atoms/cm$^2$ or less.

Details of the Embodiment of the Present Disclosure

Hereinafter, the embodiment of the present disclosure will be described based on the drawings. It should be noted that, in the drawings below, identical or corresponding parts will be designated by the same reference numerals, and the description thereof will not be repeated. Regarding crystallographic indications in the present specification, an individual orientation is represented by [ ], a group orientation is represented by < >, an individual plane is represented by ( ), and a group plane is represented by { }. Generally, a negative index is supposed to be crystallographically indicated by putting "–" (bar) above a numeral, but is indicated by putting the negative sign before the numeral in the present specification.

<Configuration of Silicon Carbide Substrate>

Figure 2:
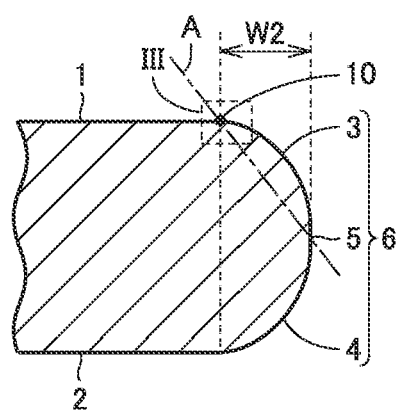
FIG. 2 is a schematic cross sectional view taken along a line II-II in FIG. 1.

First, a configuration of silicon carbide substrate 100 in accordance with the present embodiment will be described. FIG. 1 is a schematic plan view showing a configuration of silicon carbide substrate 100 in accordance with the present embodiment. FIG. 2 is a schematic cross sectional view taken along a line II-II in FIG. 1.

As shown in FIGS. 1 and 2, silicon carbide substrate 100 in accordance with the present embodiment mainly has first main surface 1, second main surface 2, and chamfered portion 6. Second main surface 2 is opposite to first main surface 1. Chamfered portion 6 is contiguous to each of first main surface 1 and second main surface 2. Each of first main surface 1 and second main surface 2 is a flat surface. First main surface 1 is a surface on which an epitaxial layer (not shown) is to be formed. Silicon carbide substrate 100 is made of a hexagonal silicon carbide single crystal having a polytype of 4H, for example. Silicon carbide substrate 100 contains an n type impurity such as nitrogen, for example.

First main surface 1 is a {0001} plane, or a plane angled off by less than or equal to 8° relative to the {0001} plane, for example. Specifically, first main surface 1 is a (0001) plane, or a plane angled off by less than or equal to 8° relative to the (0001) plane, for example. First main surface 1 may be a (000-1) plane, or a plane angled off by less than or equal to 8° relative to the (000-1) plane, for example. When first main surface 1 is the (0001) plane, second main surface 2 is the (000-1) plane.

As shown in FIG. 2, chamfered portion 6 has a first curved region 3, an outer circumferential end portion 5, and a second curved region 4. First curved region 3 is contiguous to first main surface 1. First curved region 3 is located more outward than first main surface 1. Second curved region 4 is contiguous to second main surface 2. Second curved region 4 is located more outward than second main surface 2. As shown in FIG. 2, in a cross section perpendicular to first main surface 1, each of first curved region 3 and second curved region 4 is arc-shaped. Each of first curved region 3 and second curved region 4 is curved to protrude outward.

Outer circumferential end portion 5 is a portion located most outward in a radial direction parallel to first main surface 1. Outer circumferential end portion 5 is contiguous to each of first curved region 3 and second curved region 4. In the radial direction, first curved region 3 is located between first main surface 1 and outer circumferential end portion 5. Similarly, in the radial direction, second curved region 4 is located between second main surface 2 and outer circumferential end portion 5.

As shown in FIG. 1, outer circumferential end portion 5 has an orientation flat portion 7 and an arc-shaped portion 8. Arc-shaped portion 8 is contiguous to orientation flat portion 7. Orientation flat portion 7 extends along a first direction 101. Each of first direction 101 and a second direction 102 is parallel to first main surface 1. Second direction 102 is a direction perpendicular to first direction 101. First direction 101 is a <11-20> direction, for example. Second direction 102 is a <1-100> direction, for example.

When first main surface 1 is inclined relative to the {0001} plane, first direction 101 may be a direction in which the <11-20> direction is projected to first main surface 1, for example. When first main surface 1 is inclined relative to the {0001} plane, second direction 102 may be a direction in which the <1-100> direction is projected to first main surface 1, for example.

As shown in FIG. 1, silicon carbide substrate 100 has a maximum diameter (a first width W1) of 150 mm or more. When viewed in a direction perpendicular to first main surface 1, the maximum diameter of silicon carbide substrate 100 may be calculated as a diameter of a circle including arc-shaped portion 8. First width W1 may be 200 mm or more, or may be 250 mm or more. The upper limit of first width W1 is not particularly limited, and may be 300 mm or less, for example.

As shown in FIG. 1, when viewed in the direction perpendicular to first main surface 1, chamfered portion 6 has a width (a second width W2) of 0.1 mm or more and 0.3 mm or less, for example. From another viewpoint, when viewed in the direction perpendicular to first main surface 1, a distance from a boundary between first main surface 1 and chamfered portion 6 to outer circumferential end portion 5 is 0.1 mm or more and 0.3 mm or less, for example.

Figure 3:
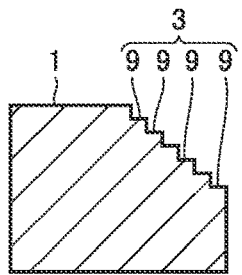
FIG. 3 is an enlarged schematic view of a region III in FIG. 2.

FIG. 3 is an enlarged schematic view of a region III in FIG. 2. As shown in FIG. 3, a plurality of level differences (grinding marks 9) are formed in chamfered portion 6. Grinding marks 9 are formed along a circumferential direction, for example.

Grinding marks 9 are formed in chamfered portion 6. Accordingly, an arithmetic mean roughness (Ra) in chamfered portion 60 is greater than an arithmetic mean roughness in each of first main surface 1 and second main surface 2. The arithmetic mean roughness in each of first main surface 1 and second main surface 2 is 0.056 nm, for example. The arithmetic mean roughness in each of first main surface 1 and second main surface 2 may be 0.03 nm or more and 0.2 nm or less, for example. The arithmetic mean roughness (Ra) in chamfered portion 6 is 0.1 μm, for example. The arithmetic mean roughness (Ra) in chamfered portion 6 may be 0.05 μm or more and 0.5 μm or less, for example.

Next, a method for measuring the arithmetic mean roughness (Ra) will be described.

An arithmetic surface roughness (Ra) can be measured using an atomic force microscope (AFM) or a stylus-type surface roughness measuring instrument. As the AFM, "Dimension 300" manufactured by Veeco can be used, for example. As a cantilever (probe), "NCHV-10V" manufactured by Bruker can be used, for example. As the stylus-type surface roughness measuring instrument, "SURFCOM 1800G" manufactured by Tokyo Seimitsu can be used, for example.

The range of measurement with the AFM is set to a region from a boundary 10 between first main surface 1 and chamfered portion 6 to outer circumferential end portion 5. A straight line A which connects boundary 10 between first main surface 1 and chamfered portion 6 to outer circumferential end portion 5 serves as a reference height. As conditions for measurement with the AFM, for example, the measurement mode is set to a tapping mode, the pitch is set to 40 nm, and the measurement depth is set to 1.0 μm. For the sampling in the tapping mode, for example, the scanning speed is set to 5 seconds per cycle, the number of data per scan line is set to 512 points, and the number of scan lines is set to 512. Further, displacement control of the cantilever is set to 15.50 nm, for example.

Next, a concentration of a metal impurity in chamfered portion 6 will be described.

Sludge containing manganese tends to adhere to grinding marks 9. In silicon carbide substrate 100 in accordance with the present embodiment, sludge containing manganese (Mn) in chamfered portion 6 is reduced. Specifically, a manganese concentration in chamfered portion 6 is $1\times10^{11}$ atoms/cm$^2$ or less. The manganese concentration in chamfered portion 6 is preferably $1\times10^{10}$ atoms/cm$^2$ or less, and more preferably $1\times10^{9}$ atoms/cm$^2$ or less. The lower limit of the manganese concentration in chamfered portion 6 is not particularly limited, and is $1\times10^{8}$ atoms/cm$^2$ or more, for example.

In silicon carbide substrate 100 in accordance with the present embodiment, a sodium (Na) concentration in chamfered portion 6 is $1\times10^8$ atoms/cm$^2$ or more, for example. The sodium concentration in chamfered portion 6 may be $1\times10^9$ atoms/cm$^2$ or more, or may be $1\times10^{10}$ atoms/cm$^2$ or more. The upper limit of the sodium concentration in chamfered portion 6 is not particularly limited, and may be $3\times10^{11}$ atoms/cm$^2$ or less, for example.

In silicon carbide substrate 100 in accordance with the present embodiment, a potassium (K) concentration in chamfered portion 6 is $1\times10^{11}$ atoms/cm$^2$ or less, for example. The potassium concentration in chamfered portion 6 may be $8\times10^{10}$ atoms/cm$^2$ or less, for example, or may be $6\times10^{11}$ atoms/cm$^2$ or less, for example. The lower limit of the potassium concentration in chamfered portion 6 is not particularly limited, and is $1\times10^8$ atoms/cm$^2$ or more, for example.

In silicon carbide substrate 100 in accordance with the present embodiment, an iron (Fe) concentration in chamfered portion 6 is $1\times10^{11}$ atoms/cm$^2$ or less, for example. The iron concentration in chamfered portion 6 may be $8\times10^{10}$ atoms/cm$^2$ or less, for example. The lower limit of the iron concentration in chamfered portion 6 is not particularly limited, and is $1\times10^8$ atoms/cm$^2$ or more, for example.

Next, a method for measuring the concentration of a metal impurity in chamfered portion 6 will be described.

First, an acid is dropped along the entire circumference of chamfered portion 6 of silicon carbide substrate 100 (except for orientation flat portion 7) using a horizontal substrate inspection device, and thereby a metal impurity on chamfered portion 6 is incorporated into the acid. Then, all the acid containing the metal impurity is collected from the entire circumference of chamfered portion 6. It should be noted that sample preparation is performed within a class 10 clean draft placed within a class 100 clean room.

The concentration of the metal impurity can be measured by ICP-MS (Inductively Coupled Plasma Mass Spectrometry). As a measuring device, ICP-MS8800 manufactured by Agillent can be used, for example. The mass (ng) of a metal impurity element obtained by measurement is divided by the atomic weight of the element to be converted into the number of moles, and then the number of moles is multiplied by the Avogadro number to be converted into the number of atoms. Then, the number of atoms is divided by the area of chamfered portion 6 to obtain the number of atoms per unit area. The concentration of the metal impurity is the number of atoms per unit area. It should be noted that, when silicon carbide substrate 100 has a maximum diameter of 150 mm, chamfered portion 6 has an area of about 3.78 cm$^2$. The area of chamfered portion 6 is calculated as the area of a rectangle with a long side having the length of outer circumferential end portion 5 of silicon carbide substrate 100, and a short side having the width (second width W2) of chamfered portion 6, when viewed in the direction perpendicular to first main surface 1 (see FIG. 1).

Next, a concentration of a metal impurity in first main surface 1 will be described.

Manganese may be present in first main surface 1. In first main surface 1, a manganese concentration may be $1\times10^9$ atoms/cm$^2$ or less. The manganese concentration in first main surface 1 is lower than the manganese concentration in chamfered portion 6.

Sodium may be present in first main surface 1. In first main surface 1, a sodium concentration may be $5\times10^{10}$ atoms/cm$^2$ or less. The sodium concentration in first main surface 1 is lower than the sodium concentration in chamfered portion 6.

Potassium may be present in first main surface 1. In first main surface 1, a potassium concentration may be $2\times10^{10}$ atoms/cm$^2$ or less. The potassium concentration in first main surface 1 is lower than the potassium concentration in chamfered portion 6.

Iron may be present in first main surface 1. In first main surface 1, an iron concentration may be $5\times10^9$ atoms/cm$^2$ or less. The iron concentration in first main surface 1 is lower than the iron concentration in chamfered portion 6.

Sulfur (S) may be present in first main surface 1. In first main surface 1, a sulfur concentration may be $5\times10^{10}$ atoms/cm$^2$ or more. In first main surface 1, the sulfur concentration may be $1\times10^{12}$ atoms/cm$^2$ or more.

Chlorine (Cl) may be present in first main surface 1. In first main surface 1, a chlorine concentration may be $5\times10^{10}$ atoms/cm$^2$ or more. In first main surface 1, the chlorine concentration may be $1\times10^{12}$ atoms/cm$^2$ or more.

Next, a method for measuring the concentration of a metal impurity in first main surface 1 will be described.

The concentration of a metal impurity can be measured with a total reflection fluorescent X-ray analysis device. As the analysis device, TXRF-3760 manufactured by Rigaku can be used, for example. The analysis device has a plurality of excited X-ray sources, and can measure an element from a light element Na to a heavy element U using an excited X-ray optimal for the measured element. Specifically, an excited X-ray of W-Ma (1.78 keV) is used for Na, and an excited X-ray of W-Lb (9.67 keV) is used for K, S, Fe, Cl, and Mn.

The power of the X-ray is 35 kV-255 mA, for example. The incidence azimuth is 39°. The incident angle of W-Ma is 0.500°. The measurement time of W-Ma is 10 seconds/point. The incident angle of W-Lb is 0.100°. The measurement time of W-Lb is 10 seconds/point. Further, the analysis device has an XY drive stage, and can measure in-plane distribution of the measured element. For example, first main surface 1 is divided into 101 regions having an equal area, and the concentration of the measured element can be measured at each of the 101 regions. The concentration of the metal impurity in the first main surface is defined as an average value of the concentrations at the 101 regions. The concentration of the metal impurity is the number of atoms per unit area.

<Method for Manufacturing Silicon Carbide Substrate>

Figure 4:
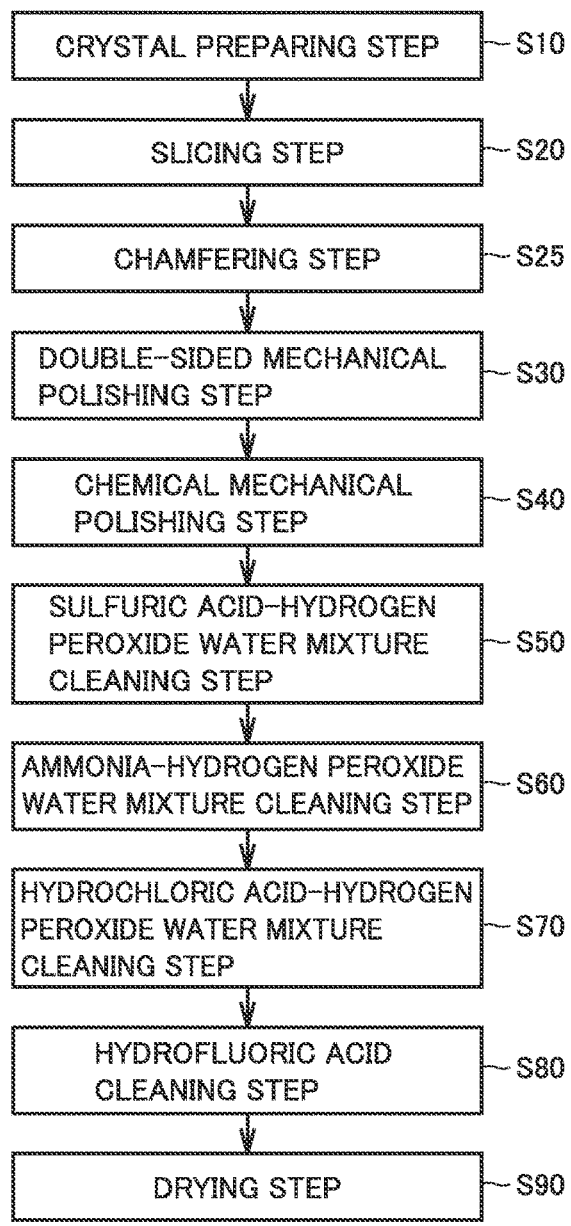
FIG. 4 is a flowchart schematically showing a method for manufacturing the silicon carbide substrate in accordance with the present embodiment.

Next, a method for manufacturing silicon carbide substrate 100 in accordance with the present embodiment will be described. As shown in FIG. 4, the method for manufacturing silicon carbide substrate 100 in accordance with the present embodiment includes a crystal preparing step (S10), a slicing step (S20), a chamfering step (S25), a double-sided mechanical polishing step (S30), a chemical mechanical polishing step (S40), a sulfuric acid-hydrogen peroxide water mixture cleaning step (S50), an ammonia-hydrogen peroxide water mixture cleaning step (S60), a hydrochloric acid-hydrogen peroxide water mixture cleaning step (S70), a hydrofluoric acid cleaning step (S80), and a drying step (S90).

Figure 5:
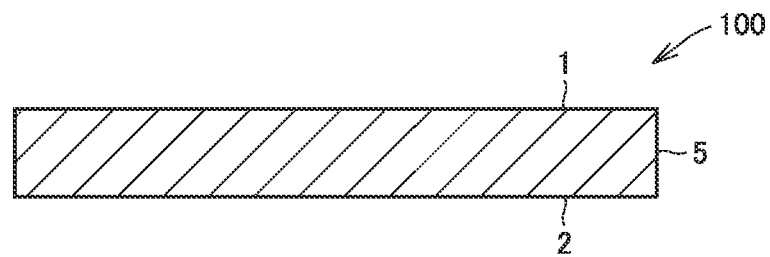
FIG. 5 is a schematic cross sectional view showing a first step of the method for manufacturing the silicon carbide substrate in accordance with the present embodiment.

First, the crystal preparing step (S10) is performed. In the crystal preparing step (S10), a silicon carbide ingot is formed by a sublimation method, for example. Then, the slicing step (S20) is performed. In the slicing step (S20), the silicon carbide ingot is cut into a plurality of silicon carbide substrates 100 by a saw wire. Silicon carbide substrate 100 is made of a hexagonal silicon carbide single crystal having a polytype of 4H, for example. As shown in FIG. 5, silicon carbide substrate 100 has first main surface 1, second main surface 2, and outer circumferential end portion 5. At this point of time, chamfered portion 6 is not formed.

Figure 6:
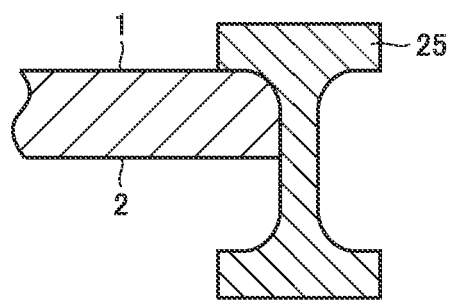
FIG. 6 is a schematic cross sectional view showing a second step of the method for manufacturing the silicon carbide substrate in accordance with the present embodiment.
Figure 7:
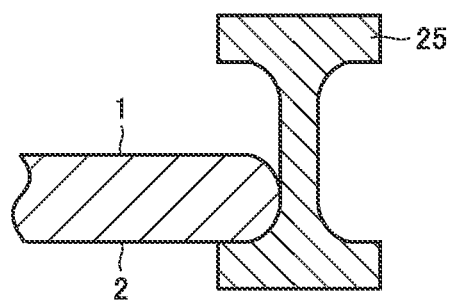
FIG. 7 is a schematic cross sectional view showing a third step of the method for manufacturing the silicon carbide substrate in accordance with the present embodiment.

Then, the chamfering step (S25) is performed. In the chamfering step (S25), a grinding device 25 is used. In the chamfering step, diamond abrasive grains are used, for example. As shown in FIG. 6, the vicinity of a boundary between first main surface 1 and outer circumferential end portion 5 of silicon carbide substrate 100 is pressed against rotating grinding device 25. Similarly, as shown in FIG. 7, the vicinity of a boundary between first main surface 1 and outer circumferential end portion 5 of silicon carbide substrate 100 is pressed against rotating grinding device 25. Thereby, chamfered portion 6 is formed in silicon carbide substrate 100 (see FIG. 2). In the chamfering step (S25), grinding marks may be formed in chamfered portion 6.

Then, the double-sided mechanical polishing step (S30) is performed. Specifically, silicon carbide substrate 100 is placed between a first surface plate (not shown) and a second surface plate (not shown) such that first main surface 1 faces the first surface plate and second main surface 2 corresponds to the second surface plate. Then, slurry is introduced between first main surface 1 and the first surface plate and between second main surface 2 and the second surface plate. The slurry contains diamond abrasive grains and water, for example. The diamond abrasive grains have diameters of 0.5 µm or more and 3 µm or less, for example. Mechanical polishing is performed on both sides of silicon carbide substrate 100 by applying a load to first main surface 1 by the first surface plate and applying a load to second main surface 2 by the second surface plate.

Then, the chemical mechanical polishing step (S40) is performed. Specifically, first, CMP (Chemical Mechanical Polishing) is performed in first main surface 1 of silicon carbide substrate 100. As abrasive grains, colloidal silica is used, for example. A polishing solution containing a permanganate is used. A polishing cloth is attached to a surface plate. The polishing cloth is a nonwoven fabric, for example. The processing pressure is 300 g/cm$^2$, for example. The flow rate of the polishing solution is 50 cc/minute, for example. The number of rotations of the surface plate is 40 rpm, for example. The processing time is two hours, for example.

Figure 8:
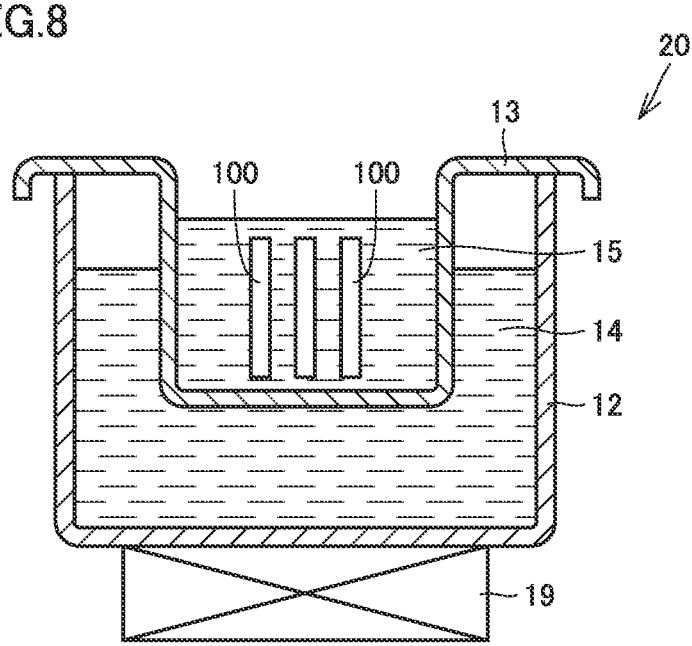
FIG. 8 is a schematic cross sectional view showing a fourth step of the method for manufacturing the silicon carbide substrate in accordance with the present embodiment.

Then, the sulfuric acid-hydrogen peroxide water mixture cleaning step (S50) is performed. In the sulfuric acid-hydrogen peroxide water mixture cleaning step (S50), an ultrasonic wave cleaning device is used. As shown in FIG. 8, an ultrasonic wave cleaning device 20 mainly has an ultrasonic wave generation source 19, a first cleaning tank 12, and a second cleaning tank 13. Second cleaning tank 13 is placed on first cleaning tank 12. Second cleaning tank 13 is hung on an opening of first cleaning tank 12. A first cleaning solution 14 (specifically, water) is put in first cleaning tank 12. A second cleaning solution 15 (specifically, a sulfuric acid-hydrogen peroxide water mixture) is put in second cleaning tank 13. Silicon carbide substrate 100 is immersed in the sulfuric acid-hydrogen peroxide water mixture. Ultrasonic wave generation source 19 is placed at the bottom of second cleaning tank 13. Second cleaning tank 13 is placed on ultrasonic wave generation source 19.

In the sulfuric acid-hydrogen peroxide water mixture cleaning step (S50), silicon carbide substrate 100 is cleaned with the sulfuric acid-hydrogen peroxide water mixture being irradiated with ultrasonic waves, in order to improve the effect of removing a metal impurity. The ultrasonic waves have a frequency of 450 kHz or more and 2 MHz or less, for example. The ultrasonic waves promote a chemical reaction. This enhances the reactivity of the metal impurity to the sulfuric acid-hydrogen peroxide water mixture. Further, the sludge containing manganese which has entered the grinding marks in chamfered portion 6 can be effectively removed by a cavitation effect caused by irradiation of the ultrasonic waves.

In the sulfuric acid-hydrogen peroxide water mixture cleaning step (S50), an organic substance, a metal impurity, and the like are mainly removed. The sulfuric acid-hydrogen peroxide water mixture is a solution in which sulfuric acid, hydrogen peroxide water, and ultrapure water are mixed. As the sulfuric acid, concentrated sulfuric acid having a mass percentage concentration of 96% can be used, for example. As the hydrogen peroxide water, hydrogen peroxide water having a mass percentage concentration of 30% can be used, for example. The same applies to the hydrogen peroxide water used in the subsequent steps.

The volume ratio among the sulfuric acid, the hydrogen peroxide water, and the ultrapure water contained in the sulfuric acid-hydrogen peroxide water mixture is from 10 (sulfuric acid): 1 (hydrogen peroxide water): 1 (ultrapure water) to 10 (sulfuric acid): 3 (hydrogen peroxide water): 1 (ultrapure water), for example. In other words, the volume of the sulfuric acid is 10 times the volume of the ultrapure water. The volume of the hydrogen peroxide water is one time or more and three times or less of the volume of the ultrapure water. The immersion time of silicon carbide substrate 100 is five minutes or more, for example. The temperature of the sulfuric acid-hydrogen peroxide water mixture is room temperature, for example.

Then, the ammonia-hydrogen peroxide water mixture cleaning step (S60) is performed. In the ammonia-hydrogen peroxide water mixture cleaning step (S60), a polishing agent and dust are mainly removed. An ammonia-hydrogen peroxide water mixture is a solution in which an aqueous ammonia solution, hydrogen peroxide water, and ultrapure water are mixed. As the aqueous ammonia solution, an aqueous ammonia solution having a mass percentage concentration of 28% can be used, for example. In the ammonia-hydrogen peroxide water mixture cleaning step (S60), silicon carbide substrate 100 may be cleaned with the ammonia-hydrogen peroxide water mixture being irradiated with ultrasonic waves.

The volume ratio among the aqueous ammonia solution, the hydrogen peroxide water, and the ultrapure water contained in the ammonia-hydrogen peroxide water mixture is from 1 (aqueous ammonia solution): 1 (hydrogen peroxide water): 5 (ultrapure water) to 1 (aqueous ammonia solution): 1 (hydrogen peroxide water): 10 (ultrapure water). In other words, the volume of the aqueous ammonia solution is ¹⁄₁₀ or more and ⅕ or less of the volume of the ultrapure water. Further, the volume of the hydrogen peroxide water is ¹⁄₁₀ or more and ⅕ or less of the volume of the ultrapure water. The immersion time of silicon carbide substrate 100 is five minutes or more, for example. The temperature of the sulfuric acid-hydrogen peroxide water mixture is room temperature, for example.

Then, the hydrochloric acid-hydrogen peroxide water mixture cleaning step (S70) is performed. In the hydrochloric acid-hydrogen peroxide water mixture cleaning step (S70), a heavy metal is mainly removed. A hydrochloric acid-hydrogen peroxide water mixture is a solution in which hydrochloric acid, hydrogen peroxide water, and ultrapure water are mixed. As the hydrochloric acid, concentrated hydrochloric acid having a mass percentage concentration of 98% can be used, for example. In the hydrochloric acid-hydrogen peroxide water mixture cleaning step (S70), silicon carbide substrate 100 may be cleaned with the hydrochloric acid-hydrogen peroxide water mixture being irradiated with ultrasonic waves.

The volume ratio among the hydrochloric acid, the hydrogen peroxide water, and the ultrapure water contained in the hydrochloric acid-hydrogen peroxide water mixture is from 1 (hydrochloric acid): 1 (hydrogen peroxide water): 5 (ultrapure water) to 1 (hydrochloric acid): 1 (hydrogen peroxide water): 10 (ultrapure water), for example. In other words, the volume of the hydrochloric acid is 1/10 or more and 1/5 or less of the volume of the ultrapure water. Further, the volume of the hydrogen peroxide water is 1/10 or more and 1/5 or less of the volume of the ultrapure water. The immersion time of silicon carbide substrate 100 is five minutes or more, for example. The temperature of the sulfuric acid-hydrogen peroxide water mixture is room temperature, for example.

Then, the hydrofluoric acid cleaning step (S80) is performed. In the hydrofluoric acid cleaning step (S80), a silicon oxide film is removed by hydrofluoric acid, and a surface is terminated with fluorine. The hydrofluoric acid in a mixed solution in which the hydrofluoric acid and ultrapure water are mixed has a concentration of 10% or more and 40% or less, for example. The immersion time of silicon carbide substrate 100 is five minutes or more, for example. The temperature of the sulfuric acid-hydrogen peroxide water mixture is room temperature, for example. In the hydrofluoric acid cleaning step (S80), silicon carbide substrate 100 may be cleaned with the hydrofluoric acid being irradiated with ultrasonic waves.

Figure 9:
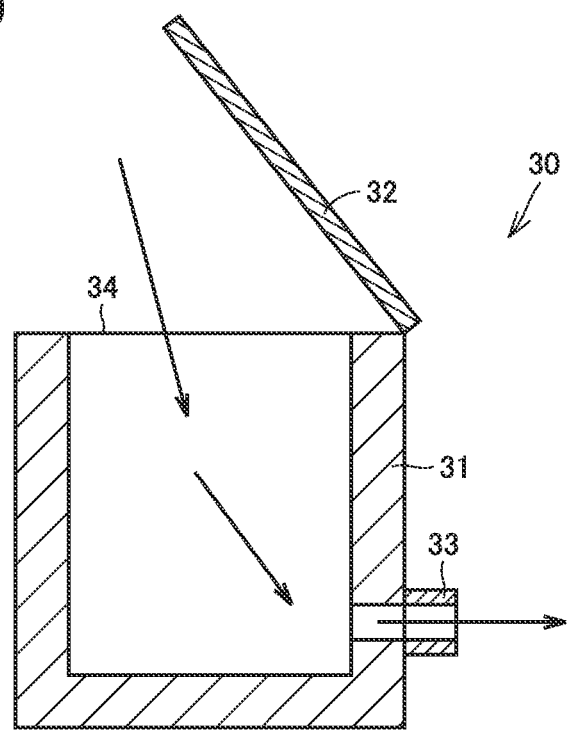
FIG. 9 is a schematic cross sectional view showing a fifth step of the method for manufacturing the silicon carbide substrate in accordance with the present embodiment.

Then, the drying step (S90) is performed. In the drying step (S90), silicon carbide substrate 100 is dried using a spin drying machine 30, for example. As shown in FIG. 9, spin drying machine 30 includes a main body portion 31, a lid 32, an opening 34, and an exhaust port 33. Spin drying machine 30 is placed in a class 100-equivalent clean room. Before silicon carbide substrate 100 is introduced into spin drying machine 30, air is passed from opening 34 toward exhaust port 33 of spin drying machine 30, with lid 32 of spin drying machine 30 being opened. The main body portion has a volume of 127000 cm$^3$, for example. Opening 34 has an area of 2700 cm$^2$, for example. The amount of the passed air is 60 m$^3$, for example.

Then, silicon carbide substrate 100 is placed in main body portion 31 of spin drying machine 30, and lid 32 is closed. Silicon carbide substrate 100 rotates about a rotation axis substantially perpendicular to first main surface 1, with pressure being reduced through exhaust port 33. The number of rotations of silicon carbide substrate 100 is 800 rpm, for example. The rotation time is 300 seconds, for example. Thereby, the cleaning solution adhering to silicon carbide substrate 100 is removed by centrifugal force.

Next, the function and effect of the present embodiment will be described.

In recent years, a polishing solution containing a permanganate has been utilized in the step of polishing silicon carbide substrate 100 in order to improve a polishing effect. The polishing solution containing a permanganate has a high polishing efficiency for silicon carbide substrate 100, whereas it has a property that it tends to be left on silicon carbide substrate 100 as an impurity. As is understood from the fact that potassium permanganate is used as a raw material for a coloring agent, for example, potassium permanganate salt turns into a mud-like sludge, and tends to adhere to silicon carbide substrate 100.

In particular, grinding marks 9 are formed in chamfered portion 6 of silicon carbide substrate 100 due to grinding processing in the chamfering step (S25). Sludge containing a permanganate tends to enter grinding marks 9 together with abrasive grains and the like. Once the sludge enters grinding marks 9, it is difficult to remove the sludge by a general cleaning method.

In the sulfuric acid-hydrogen peroxide water mixture cleaning step (S50) for silicon carbide substrate 100 in accordance with the present embodiment, silicon carbide substrate 100 is cleaned with the sulfuric acid-hydrogen peroxide water mixture being irradiated with ultrasonic waves. The ultrasonic waves promote a chemical reaction. This enhances the reactivity of a metal impurity such as manganese to the sulfuric acid-hydrogen peroxide water mixture. Further, the sludge containing manganese which has entered grinding marks 9 in chamfered portion 6 can be effectively removed by a cavitation effect caused by irradiation of the ultrasonic waves. Accordingly, the manganese concentration in chamfered portion 6 can be reduced. Specifically, the manganese concentration in chamfered portion 6 can be set to $1\times10^{11}$ atoms/cm$^2$ or less. Thereby, silicon carbide substrate 100 with a high cleanliness is obtained. As a result, when silicon carbide substrate 100 is used to fabricate a silicon carbide semiconductor device, it is possible to suppress deterioration of electrical properties of the silicon carbide semiconductor device due to a metal impurity such as manganese.

Example (Sample Preparation)

First, silicon carbide substrate 100 in accordance with a sample 1 and silicon carbide substrate 100 in accordance with a sample 2 were prepared. Silicon carbide substrate 100 in accordance with sample 1 was an example. Silicon carbide substrate 100 in accordance with sample 2 was a comparative example. Each silicon carbide substrate 100 had a maximum diameter (diameter) of 150 mm.

Silicon carbide substrate 100 in accordance with sample 1 was manufactured by the manufacturing method in accordance with the present embodiment. Specifically, in the sulfuric acid-hydrogen peroxide water mixture cleaning step (S50), the sulfuric acid-hydrogen peroxide water mixture was irradiated with ultrasonic waves. The ultrasonic waves had a frequency of 950 kHz. The volume ratio among the sulfuric acid, the hydrogen peroxide water, and the ultrapure water contained in the sulfuric acid-hydrogen peroxide water mixture was set to 10 (sulfuric acid): 1 (hydrogen peroxide water): 1 (ultrapure water). The immersion time of silicon carbide substrate 100 was set to 30 minutes. The temperature of the sulfuric acid-hydrogen peroxide water mixture was set to room temperature. On the other hand, according to a method for manufacturing silicon carbide substrate 100 in accordance with sample 2, in the sulfuric acid-hydrogen peroxide water mixture cleaning step (S50), the sulfuric acid-hydrogen peroxide water mixture was not irradiated with ultrasonic waves. Other manufacturing conditions were the same as those of the method for manufacturing silicon carbide substrate 100 in accordance with sample 1.

(Measuring Method)

Then, an acid was dropped along the entire circumference of chamfered portion 6 of silicon carbide substrate 100 (except for orientation flat portion 7) using a horizontal substrate inspection device, and the acid containing a metal impurity was collected from the entire circumference of chamfered portion 6. The concentration of the metal impurity was measured by ICP-MS. As a measuring device, ICP-MS8800 manufactured by Agilent was used, for example. The mass of a metal impurity element obtained by measurement was divided by the atomic weight of the element to be converted into the number of moles, and then the number of moles was multiplied by the Avogadro number to be converted into the number of atoms. Then, the number of atoms was divided by the area of chamfered portion 6 to obtain the number of atoms per unit area. It should be noted that chamfered portion 6 of silicon carbide substrate 100 had an area of 3.78 cm$^2$. Further, an arithmetic mean roughness (Ra) in the chamfered portion was measured using a stylus-type surface roughness measuring instrument. As the measuring device, SURFCOM 1800G manufactured by Tokyo Seimitsu was used.

(Result of Measurement)

TABLE 1

| Element | Sample 1<br>Unit<br>$10^{10}$ atoms/cm$^2$ | Sample 2<br>$10^{10}$ atoms/cm$^2$ |
| --- | --- | --- |
| Na | 11.0 | 46.0 |
| K | 4.7 | 4.1 |
| Mn | — | 12.0 |
| Fe | 7.2 | 21.0 |

Table 1 shows concentrations of metal impurities in chamfered portion 6. As shown in Table 1, in chamfered portion 6 of silicon carbide substrate 100 in accordance with sample 1, the sodium (Na) concentration was 11.0×10$^{10}$ atoms/cm$^2$. The potassium (K) concentration was 4.7×10$^{10}$ atoms/cm$^2$. Manganese (Mn) was not detected. The iron (Fe) concentration was 7.2×10$^{10}$ atoms/cm$^2$.

As shown in Table 1, in chamfered portion 6 of silicon carbide substrate 100 in accordance with sample 2, the sodium (Na) concentration was 46.0×10$^{10}$ atoms/cm$^2$. The potassium (K) concentration was 4.1×10$^{10}$ atoms/cm$^2$. Manganese (Mn) was 12.0×10$^{10}$ atoms/cm$^2$. The iron (Fe) concentration was 21.0×10$^{10}$ atoms/cm$^2$.

TABLE 2

|  | Sample 1 | Sample 2 |
| --- | --- | --- |
| Arithmetic Mean Roughness (Ra) | 0.1 μm | 0.1 μm |

Table 2 shows an arithmetic mean roughness (Ra) in chamfered portion 6. As shown in Table 2, chamfered portion 6 of silicon carbide substrate 100 in accordance with sample 1 had an arithmetic mean roughness (Ra) of 0.1 μm. On the other hand, chamfered portion 6 of silicon carbide substrate 100 in accordance with sample 2 had an arithmetic mean roughness (Ra) of 0.1 μm.

As described above, it was confirmed that sludge containing manganese (Mn) adhering to chamfered portion 6 was removed by cleaning silicon carbide substrate 100 with the sulfuric acid-hydrogen peroxide water mixture being irradiated with ultrasonic waves, and silicon carbide substrate 100 with a low manganese concentration in chamfered portion 6 can be manufactured.

It should be understood that the embodiment and the example disclosed herein are illustrative and non-restrictive in every respect. The scope of the present invention is defined by the scope of the claims, rather than the above description, and is intended to include any modifications within the scope and meaning equivalent to the scope of the claims.

REFERENCE SIGNS LIST

1: first main surface; 2: second main surface; 3: first curved region; 4: second curved region; 5: outer circumferential end portion; 6: chamfered portion; 7: orientation flat portion; 8: arc-shaped portion; 9: grinding marks; 10: boundary; 12: first cleaning tank; 13: second cleaning tank; 14: first cleaning solution; 15: second cleaning solution; 19: ultrasonic wave generation source; 20: ultrasonic wave cleaning device; 25: grinding device; 30: spin drying machine; 31: main body portion; 32: lid; 33: exhaust port; 34: opening; 100: silicon carbide substrate; 101: first direction; 102: second direction; A: straight line; W1: first width; W2: second width.

The invention claimed is:

1. A silicon carbide substrate comprising:
a first main surface;
a second main surface opposite to the first main surface; and
a chamfered portion contiguous to each of the first main surface and the second main surface,
the silicon carbide substrate having a maximum diameter of 150 mm or more,
a surface manganese concentration in the chamfered portion being 1×10$^{11}$ atoms/cm$^2$ or less, and
a manganese concentration in the first main surface is 1×10$^9$ atoms/cm$^2$ or less and lower than the surface manganese concentration in the chamfered portion.

2. The silicon carbide substrate according to claim 1, wherein an arithmetic mean roughness in the chamfered portion is greater than an arithmetic mean roughness in each of the first main surface and the second main surface.

3. The silicon carbide substrate according to claim 1, wherein a surface sodium concentration in the chamfered portion is 1×10$^8$ atoms/cm$^2$ or more.

4. The silicon carbide substrate according to claim 1, wherein a surface sodium concentration in the chamfered portion is 3×10$^{11}$ atoms/cm$^2$ or less.

5. The silicon carbide substrate according to claim 1, wherein a surface potassium concentration in the chamfered portion is 1×10$^{11}$ atoms/cm$^2$ or less.

6. The silicon carbide substrate according to claim 1, wherein a surface iron concentration in the chamfered portion is 1×10$^{11}$ atoms/cm$^2$ or less.

* * * * *